(12) United States Patent
Mun

(10) Patent No.: US 6,239,030 B1
(45) Date of Patent: May 29, 2001

(54) METHOD OF FABRICATING A TRENCH ISOLATION STRUCTURE FOR A SEMICONDUCTOR DEVICE

(75) Inventor: Chear-Yeon Mun, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/327,977

(22) Filed: Jun. 8, 1999

(30) Foreign Application Priority Data

Jun. 8, 1998 (KR) .................................................. 98-21037

(51) Int. Cl.[7] ...................................................... H01L 21/00
(52) U.S. Cl. .............................. 438/692; 216/38; 216/88; 438/745; 438/753
(58) Field of Search ........................................ 438/691, 692, 438/693, 719, 734, 745, 753, 756, 757, 749, 751; 216/38, 88, 89

(56) References Cited

U.S. PATENT DOCUMENTS 5,516,721 * 5/1996 Galli et al. ........................ 438/692 X
6,060,399 * 5/2000 Kim et al. ............................ 438/719

\* cited by examiner

*Primary Examiner*—William Powell
(74) *Attorney, Agent, or Firm*—Marger Johnson & McCollom, P.C.

(57) ABSTRACT

The present invention discloses a method for fabricating a trench isolation structure in a semiconductor device. A first insulating layer and a first anti-oxidation layer are formed on a semiconductor substrate. Then, a predetermined region of the surface of the substrate is exposed. Thereafter, a trench is formed by etching the exposed surface of the substrate. A second insulating layer is formed along an inner surface of the trench. Next, the first anti-oxidation layer is isotropically etched to a predetermined thickness. A second anti-oxidation layer is formed on the resultant structure. A third insulating layer is formed on the second anti-oxidation layer. The third insulating layer and the first and second anti-oxidation layers are planarized. Finally, the first anti-oxidation layer is removed.

20 Claims, 9 Drawing Sheets

METHOD OF FABRICATING A TRENCH ISOLATION STRUCTURE FOR A SEMICONDUCTOR DEVICE

BACKGROUND OF THE INVENTION

1. Field of the Invention

The present invention relates to a method of fabricating a semiconductor device and, more particularly, to a method of fabricating a semiconductor device having an improved trench isolation structure.

2. Discussion of Related Art

As the integration of a semiconductor device increases, a very fine pattern is required or fabricating the semiconductor device. Also, the channel length of the transistor and the width of a field oxidation layer for device isolation are reduced. Accordingly, various device isolation methods such as LOCOS, modified LOCOS, or trench isolation methods have been developed.

FIGS. 1 to 6 illustrate a conventional semiconductor device isolation method applying the trench isolation technique. Such method is described in the following six steps.

In the first step, as illustrated in FIG. 1, a first insulating layer 12 of a heat-oxidation layer and a first anti-oxidation layer 14 of a nitride layer are sequentially formed on the semiconductor substrate, for example, the silicon substrate 10. A photoresist pattern (not shown) is formed thereon, excluding the surface of the first anti-oxidation layer 14 of a non-active region. Here, the first insulating layer 12 is formed in the range of 120 to 180 Å in thickness and the fist anti-oxidation layer 14 is formed in the range of 1300 to 1700 Å in thickness. Thereafter, the first anti-oxidation layer 14 and the first insulating layer 12 are sequentially etched to expose the surface of the substrate of the non-active region, using the photoresist pattern as a mask. Next, photoresist pattern is removed; leaving the first anti-oxidation layer 14 and the first insulating layer 12 only on the active region where an active device will be formed. Then, a trench 11 is formed by partially etching the exposed surface of the substrate 10, using the etched first anti-oxidation layer 14 as a mask.

In the second step, as illustrated in FIG. 2, a second insulating layer 16 of a thermal oxidation layer is formed along the inner surface of the trench. Here, the second insulating layer 16 is formed in the range of 200 to 300 Å in thickness. The second insulating layer 16 is formed inside the trench to cure the damage on the etched surface of the silicon substrate 10 caused by the etching process for forming the trench.

In the third step, as illustrated in FIG. 3, a second anti-oxidation layer (namely, a nitride liner) 18 is formed on the substrate in the range of 60 to 150 Å in thickness. A third insulating layer 20 of an oxide layer is deposited on the second anti-oxidation layer 18, and completely fills the trench in the range of 5000 to 6000 Å in thickness.

If the silicon on the side wall of the trench is oxidized and expanded in volume due to the following oxidation process after formation of trench isolation, a dislocation in the substrate can be caused by stress applied to the silicon substrate. Second anti-oxidation layer 18 is formed between the second insulating layer 16 along the inner surface of trench and the third insulating layer 20 to prevent $O_2$ from passing through the third insulating layer 20 filled in the trench to the side wall of the trench in order to reduce the stress caused from the expansion in volume.

In the fourth step, as illustrated in FIG. 4, the third insulating layer 20 and the first and second anti-oxidation layers 14 and 18 are planarized by a chemical mechanical polishing (CMP) process.

In the fifth step, as illustrated in FIG. 5, the first anti-oxidation layer 14 is removed by using an isotropic etching process. In this step, the second anti-oxidation layer 18 is also partially etched.

In the sixth step, as illustrated in FIG. 6, the first insulating layer 12 on the active region and a predetermined upper portion of the third insulating layer 20 on the non-active region are etched by using a wet cleaning process to form trench isolation made of the second anti-oxidation layer 18 and the second and third insulating layers 16 and 20. Thereafter, a buffer oxidation layer (not shown) is formed on the active region of the substrate 10. Ion implantation processes for forming a well and for controlling the threshold voltage Vth are performed and the buffer oxidation layer is removed, completing the device isolation process.

But, with the above-mentioned device isolation method, the second anti-oxidation layer 18 has the following problems.

If the second oxidation layer 18 is made in the range of 60 to 150 Å in thickness as described above, a concave groove, the part "I" in the drawing, is generated between the second and third insulating layers 16 and 20, i.e., in the junction area of the active region and the non-active region. As illustrated in FIG. 5, the groove is generated because when the first anti-oxidation layer 14 on the active region is etched, the second anti-oxidation layer 18 on the side of the third insulating layer 20 and in the trench is also partially etched at the same time. This problem is more severe when the first insulating layer 12 and the upper portion of the third insulating layers 20 are etched. If the groove is formed on a predetermined portion of the edges of trench isolation, the polysilicon remains partially on this part during the polysilicon layer etching process for forming a gate electrode. And consequently it brings about shorts in the gate electrode, causing undesired characteristics.

If the second anti-oxidation layer 18 is formed below 50 Å in thickness to avoid this problem, it is difficult to cut off $O_2$ being passed to the side wall of the trench by using the second anti-oxidation layer during the following oxide process (for example, processes of forming a buffer oxidation layer for ion implantation, the gate insulating layer and the oxidation layer on the surface of the gate electrode). Accordingly, with the silicon on the side wall of the trench being partially oxidized, the stress is applied to the silicon substrate because of the expansion in volume and thus the silicon lattice on the side wall of the trench are twisted. This induces a dislocation in the silicon substrate and generates more defects in the subsequent process step in the junction area. This causes a leakage current, and consequently decreases the total operational characteristic of the transistor.

In short, with a thin anti-oxidation layer employed to reduce the stress applied because of the expansion in volume, it is difficult to cut off the penetration of $O_2$ to the side wall of the trench and thus the side wall of the trench can be oxidized. On the other hand, with a thick anti-oxidation layer, the second anti-oxidation layer is also partially etched during the step of isotropically etching the first anti-oxidation layer 14 used as a mask for the trench. As a result, groove is generated in this part. Consequently, a need exists for an improved method of fabricating trench isolation structure without these problems.

SUMMARY OF THE INVENTION

Accordingly, the present invention is directed to a semiconductor device fabricating method that substantially obviates one or more of the problems of the related art.

An object of the present invention is to provide an improved semiconductor device fabricating method. In accordance with the present invention, though the anti-oxidation layer (a nitride liner) on the inner surface of a trench is made relatively thick, the method of the present invention can remove the problems of the undesired characteristic caused from the remaining polysilicon when forming the gate electrode and of the damage on the side wall of the trench during the following oxidation process, by changing the process so as to prevent the formation of the concave groove in a predetermined portion on the edges of the trench isolation.

Additional features and advantages of the invention will be set forth in the description as follows. The objectives and other advantages of the invention will be realized by the structure particularly pointed out in the written description and claims hereof as well as the appended drawings.

To achieve these and other advantages of the present invention, the first embodiment of the invention includes the following steps of:

sequentially forming a first insulating layer and a first anti-oxidation layer on the semiconductor substrate to expose a predetermined part of the substrate;

forming a trench by partially etching the exposed surface of the substrate, using the first anti-oxidation layer as a mask;

forming a second insulating layer along an inner surface of the trench;

isotropically etching the first anti-oxidation layer to a predetermined thickness;

forming a second anti-oxidation layer covering the second insulating layer including the exposed first anti-oxidation layer;

forming a third insulating layer on the second anti-oxidation layer to fill the trench;

planarizing the third insulating layer by a CMP process to expose the first and second anti-oxidation layers; and removing the first anti-oxidation layer.

The second embodiment of the invention includes the following steps of:

sequentially forming a first insulating layer and a first anti-oxidation layer on the semiconductor substrate to expose a predetermined portion on the surface of the substrate and forming a spacer on its side wall;

forming a trench by partially etching the exposed surface of the substrate by using the first anti-oxidation layer and the spacer, and removing the spacer;

forming the second insulating layer along an inner surface of the trench;

forming a second anti-oxidation layer covering the second insulating layer including the first anti-oxidation layer and the first insulating layer;

forming a third insulating layer on the second anti-oxidation layer to fill the trench;

planarizing the third insulating layer by a CMP process to expose the first and second anti-oxidation layers to a predetermined thickness; and removing the first anti-oxidation layer.

BRIEF DESCRIPTION OF THE ATTACHED DRAWINGS

The above object and advantages of the present invention will become more apparent by describing in detail a preferred embodiment thereof with reference to the attached drawings in which.

DETAILED DESCRIPTION OF PREFERRED EMBODIMENT

Reference will now be made in detail to the preferred embodiments of the present invention, examples of which are illustrated in the accompanying drawings.

The method of the present invention is to prevent the silicon oxidation on the side wall of the trench during the oxidation process after forming the trench, such as one for forming an ion implanting buffer oxidation layer, other for forming a gate insulating layer and the other for forming an oxidation layer on the surface of a gate electrode, by changing the process so as to prevent the formation of the concave groove in a predetermined portion on the edges of the trench isolation. It will be described below in detail with reference to FIGS. 7 to 18.

Here, FIGS. 7 to 12 illustrate the device isolation process of a semiconductor device in accordance with a first embodiment of the invention. FIGS. 13 to 18 illustrate the device isolation process of a semiconductor device in accordance with a second embodiment of the invention.

First, the first embodiment of the invention will be described in six steps.

Figure 1:
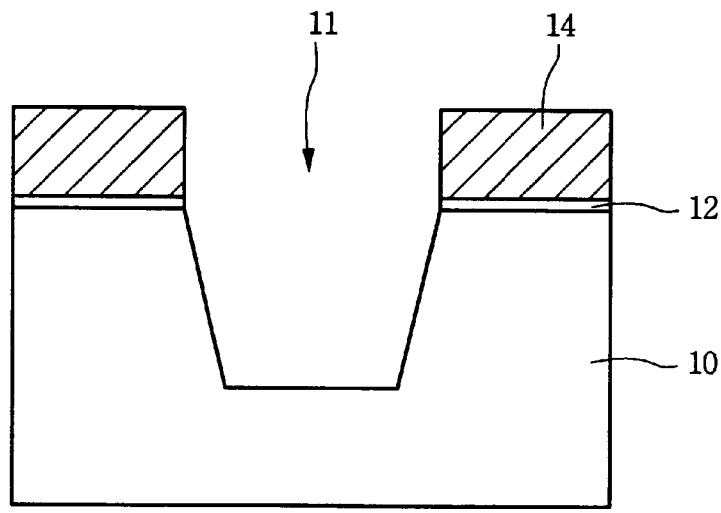
FIGS. 1 to 6 illustrate the conventional device isolation process of a conventional semiconductor device.
Figure 2:
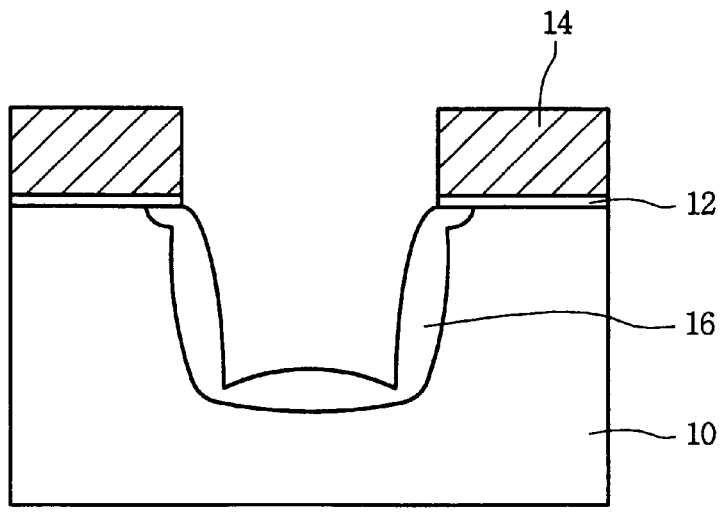
Figure 3:
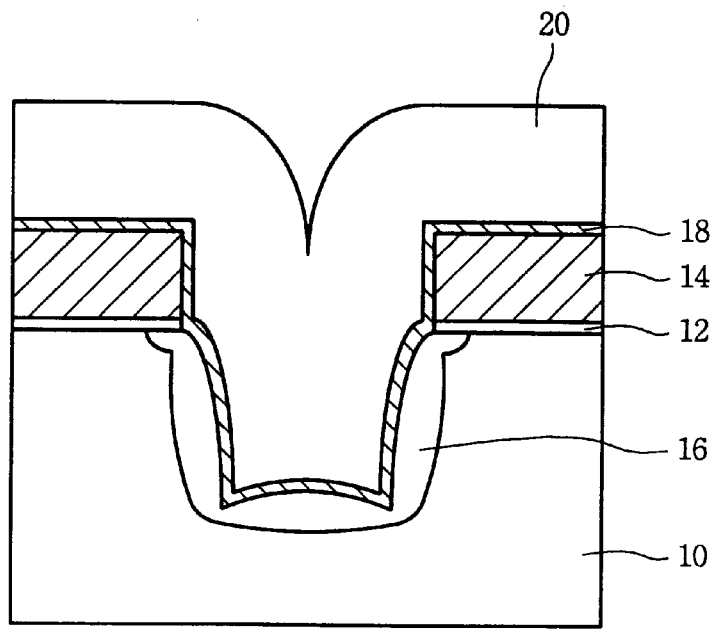
Figure 4:
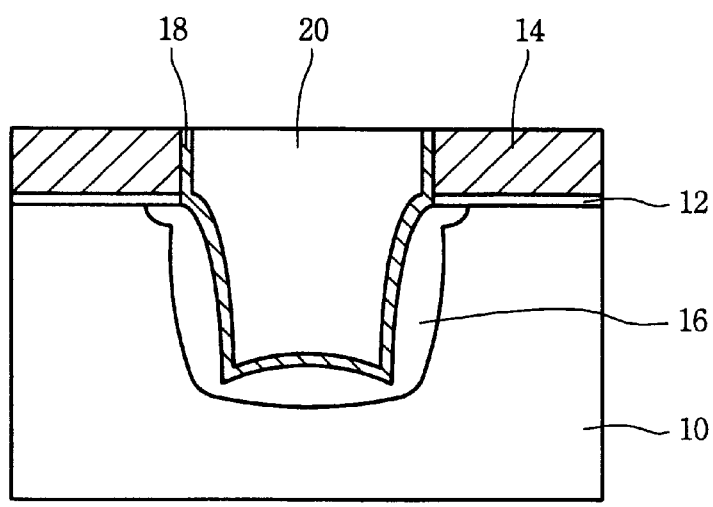
Figure 5:
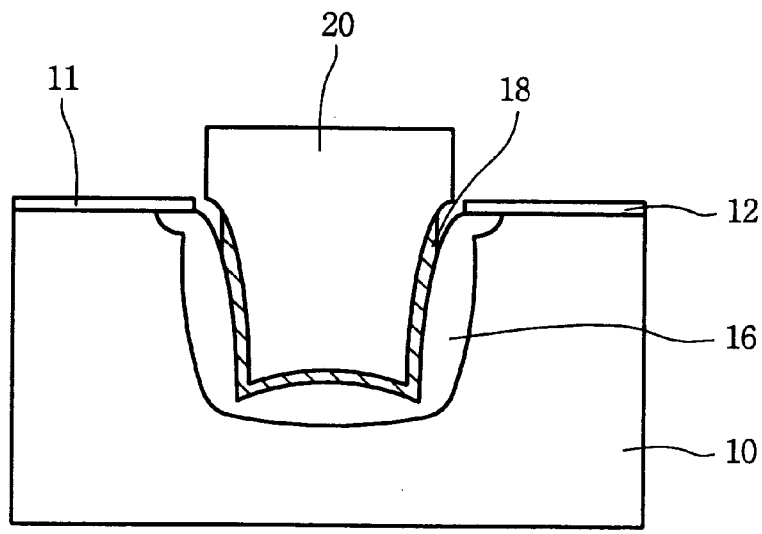
Figure 6:
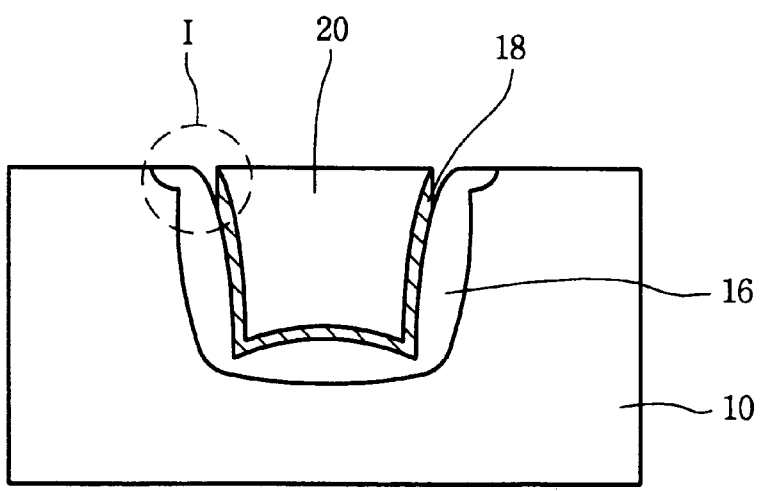
Figure 7:
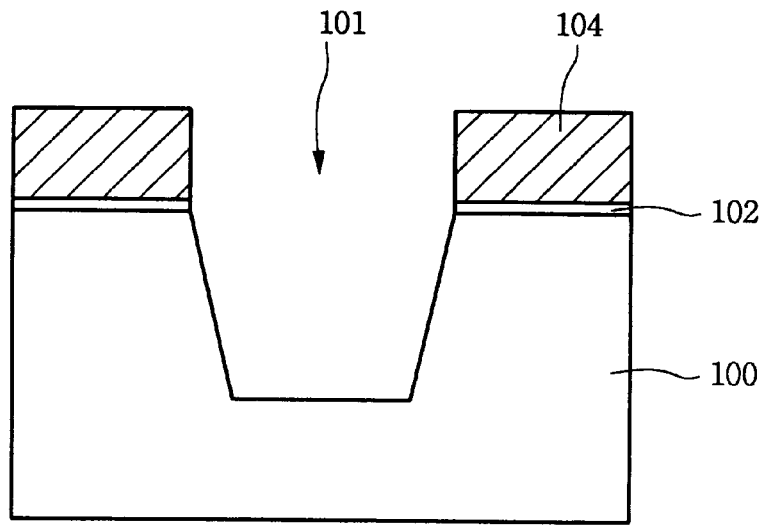
FIGS. 7 to 12 illustrate the device isolation process of a semiconductor device in accordance with a first embodiment of the invention.

As illustrated in FIG. 7, a first insulating layer 102 of a thermal oxidation layer and a first anti-oxidation layer 104 of a nitride layer are sequentially formed on the semiconductor substrate (for example, a silicon substrate) 100. A photoresist pattern (not shown) is formed thereon, excluding the first anti-oxidation layer 104 of a non-active region. Here, the first insulating layer 102 is formed in the range of 120 to 180 Å in thickness and the first anti-oxidation layer 104 is formed in the range of 1300 to 1700 Å in thickness. Thereafter, the first anti-oxidation layer 104 and the first insulating layer 102 are sequentially etched to expose the surface of the non-active region by using the photoresist pattern as a mask. The photoresist pattern is removed, leaving the first anti-oxidation layer 104 and the first insulating layer 102 only on the active region where the active device will be formed. The exposed surface of the substrate 100 is partially etched by using the first anti-oxidation layer 104 as a mask, thereby forming a trench 101.

Also, the trench formation process can be performed in the following way. Using the photoresist pattern as a mask, the first anti-oxidation layer 104 and the first insulating layer 102 are sequentially etched. Next, the exposed part of the substrate 100 is partially etched to thereby form the trench and then the photoresist pattern is removed.

Figure 8:
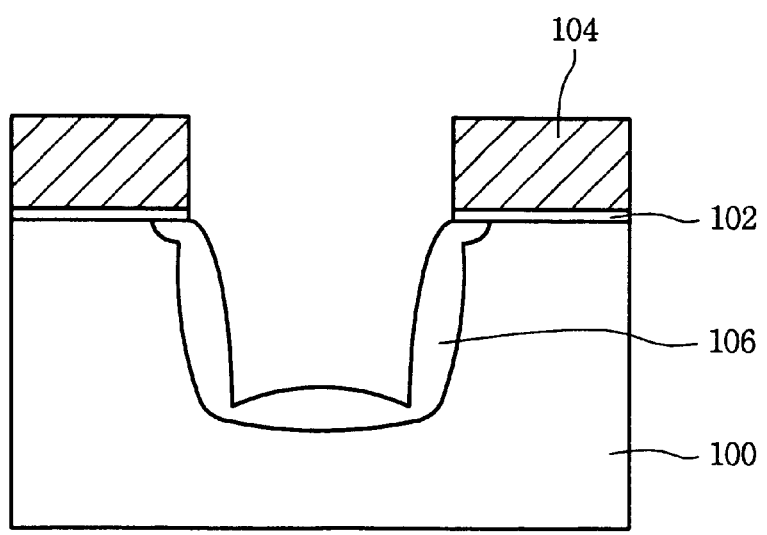
Figure 9:
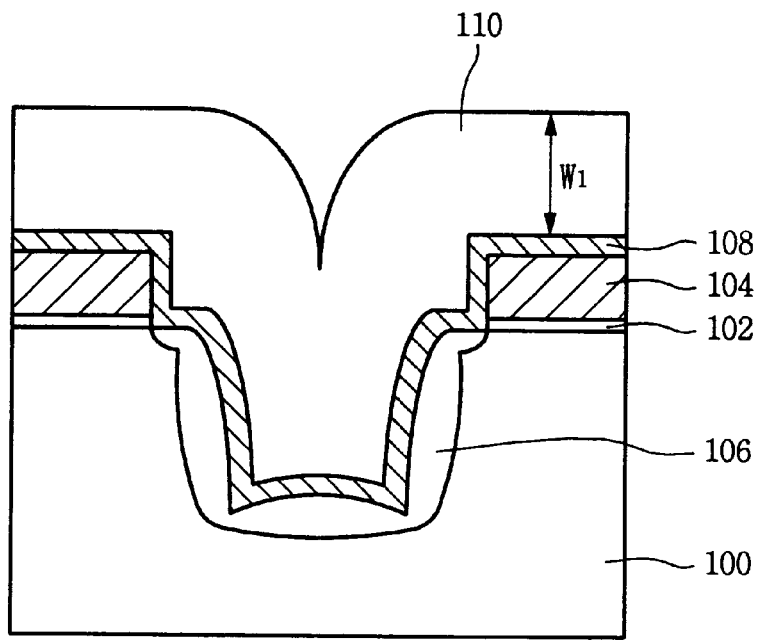

As illustrated in FIGS. 8 and 9, the second insulating layer 106 of a thermal oxidation layer is formed along the inner surface of the trench. Here, the second insulating layer 106 is formed having a thickness of 150 to 300 Å.

The first anti-oxidation layer 104 is isotropically etched to a predetermined thickness as shown in FIG. 9. The first insulating layer 102 may be etched or not be etched together with the first anti-oxidation layer 104. When first insulating layer 102 is etched, an upper surface of the second insulating layer 106 is consequently exposed. Here, the isotropic etching process reduces the thickness of the first anti-oxidation layer 104 to leave about 50% or 90% of its original thickness. Alternatively, after the isotropic etching process for the first anti-oxidation layer, the second insulating layer 106 is formed along the inner surface of the trench. As illustrated in FIG. 9, the second anti-oxidation layer 108 of a nitride layer is formed on the overall surface of the above substrate to cover the first anti-oxidation layer, the first insulating layer and the second insulating layer. The second anti-oxidation layer 108 includes a horizontal portion formed on top of the exposed upper surface of the second insulating layer 106. The second anti-oxidation layer 108 is formed in the range of 60 to 150 Å. The isotropic etching process is performed to provide an etching margin formed of a horizontal portion of second anti-oxidation layer 108 on top of the exposed upper surface of the second insulating layer 106. Such an etching margin prevents the second anti-oxidation layer 108 inside the trench from being etched when the first anti-oxidation layer 104 is etched, even though the second anti-oxidation layer 108 in the other area is partially etched. Thus, the formation of a concave groove inside the isolation trench can be prevented.

Here, during the oxidation process performed after the formation of the "trench isolation", the second anti-oxidation layer 108 cuts off the penetration of $O_2$ to the side wall of the trench through the third insulating layer 110 filling up the trench, so that the silicon substrate on the side wall of the trench is not oxidized.

Thereafter, a third insulating layer 110 of an oxide layer is formed by CVD on the second anti-oxidation layer 108 including the trench in the range of 5000 to 6000 Å in thickness, which is indicated as W1 in FIG. 9, to completely fill the trench Here, the third insulating layer 110 is formed of a single-layered structure of TEOS or multi-layered structure of "USG/TEOS".

Figure 10:
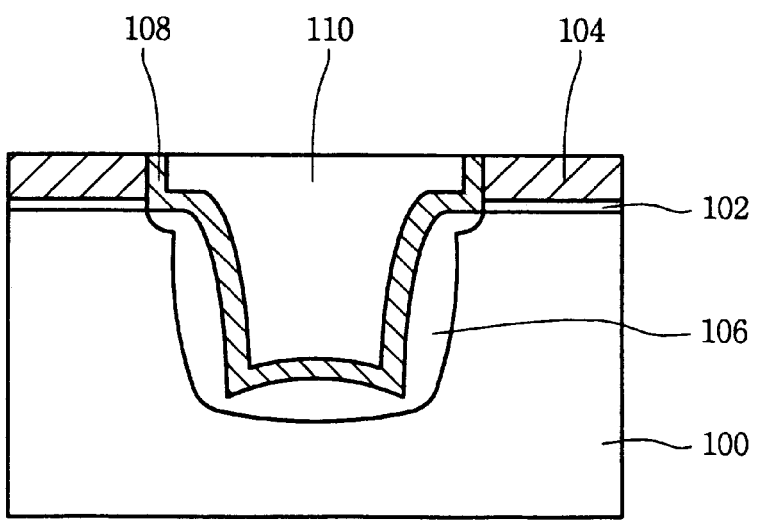

As illustrated in FIG. 10, the third insulating layer 110 is planarized by a chemical mechanical polishing (CMP) process to expose the first and second anti-oxidation layers 104 and 108, or to expose the second anti-oxidation layer 108. Here, the first and second anti-oxidation layers 104 and 108 as illustrated in FIG. 10 are etched to a predetermined thickness by the CMP process when the insulating layer 110 is planarized.

Figure 11:
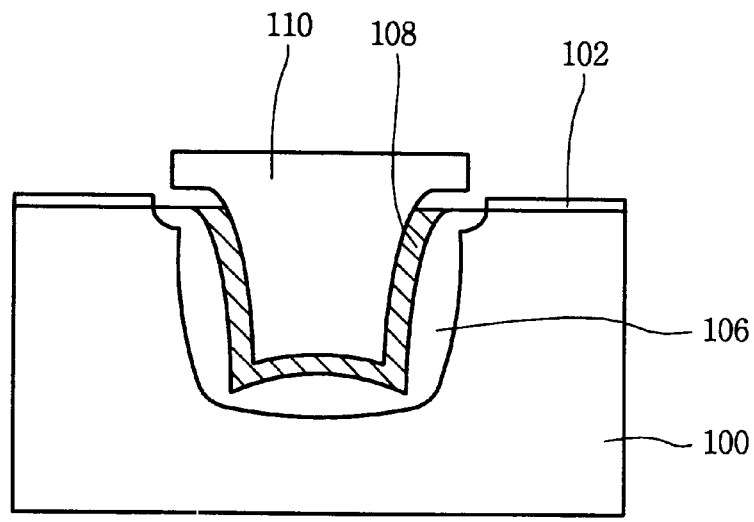

As illustrated in FIG. 11, the first anti-oxidation layer 104 of an active region is removed, using the isotropic etching process. In this step, the second anti-oxidation layer 108 on the side of the third insulating layer 110 and the second anti-oxidation layer 108 on the second insulating layer 106 are partially etched.

Figure 12:
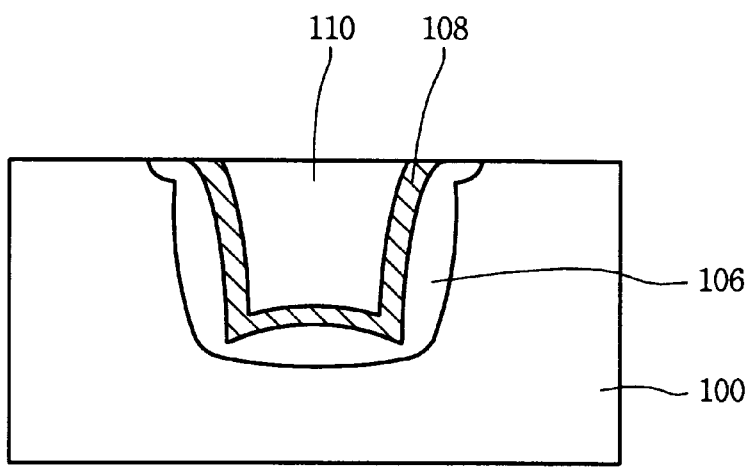

As illustrated in FIG. 12, a predetermined upper portion of the first insulating layer 102 of the active region and the upper part of the third insulating layer 110 of the non-active region are etched, using the wet cleaning process, so that "trench isolation" is formed of the second anti-oxidation layer 108 and the second and third insulating layers 106 and 110. A buffer oxidation layer (now shown) is formed on the active region of the substrate 100. Ion-implantation processes for forming a well and for controlling threshold voltage are performed and the buffer oxidation layer is removed.

With this device isolation process, though the second anti-oxidation layer 108 being a nitride liner is formed in the range of 60 to 150 Å in thickness, the layer 108 in the trench is not etched to make a groove on the edges of the trench isolation when removing the first anti-oxidation layer 104 on the active region.

Subsequently, in order to form a transistor, the gate insulating layer is formed on the portion where the buffer oxidation layer is removed. The polysilicon layer is then formed on the gate insulating layer including "trench isolation". And the polysilicon layer is selectively etched to form a gate electrode. But the polysilicon does not remain on a certain portion of the "trench isolation". Consequently, it is possible to prevent shorts of the gate electrode resulting from the remaining polysilicon.

Since the second anti-oxidation layer 108 is formed in the range of 60 to 150 Å in thickness, the penetration of $O_2$ from the third insulating layer 110 to its side wall can be sufficiently prevented using the above anti-oxidation layer during subsequent oxidation process after the formation of the "trench isolation". Thus, the silicon substrate on the side wall of the trench is no longer oxidized.

Consequently, it is possible to stop the generation of the stress due to the expansion in volume caused by the oxidation of the trench's side wall and damage to the silicon substrate on the side wall of the trench during the subsequent oxidation process. As a result, the reduction of the operational characteristic of the transistor can be avoided.

Next, a second embodiment of the invention will be described below with reference to FIGS. 13 to 18. Only the process steps that are different from the above-mentioned processes will be described in detail.

Figure 13:
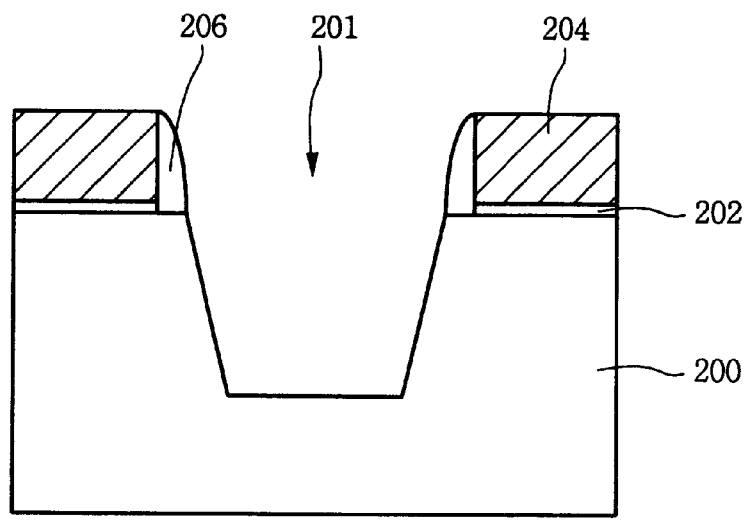
FIGS. 13 to 18 illustrate the device isolation process of a semiconductor device in accordance with a second embodiment of the invention.

As illustrated in FIG. 13, a first insulating layer 202 of a thermal oxidation layer and a first anti-oxidation layer 204 of a nitride layer are sequentially formed on the semiconductor substrate (for example, a silicon substrate) 200. A photoresist pattern (not shown) is formed thereon, excluding the first anti-oxidation layer 204 of a non-active region. Here, the first insulating layer 202 is formed in the range of 120 to 180 Å in thickness and the first anti-oxidation layer 204 is formed in the range of 1300 to 1700 Å in thickness. Thereafter, the first anti-oxidation layer 204 and the first insulating layer 202 are sequentially etched to expose the surface of the non-active region of the substrate 200 by using the photoresist pattern as a mask. The photoresist pattern is removed, leaving the first anti-oxidation layer 204 and the first insulating layer 202 only on the active region where the active device will be formed. A high-temperature oxide (HTO) layer is formed on the substrate, including the etched first anti-oxidation and insulating layers 204 and 202, and the layer is anisotropically etched to form a spacer 206 on a side wall of the etched first anti-oxidation layer 204 and first insulating layer 202 patterns. Here, the HTO layer is formed in the range of 400 to 600 Å in thickness. Thereafter, the exposed surface of the substrate 200 is partially etched by using the first anti-oxidation layer 204 and the spacer 206 as a mask, thereby forming a trench 201.

Figure 14:
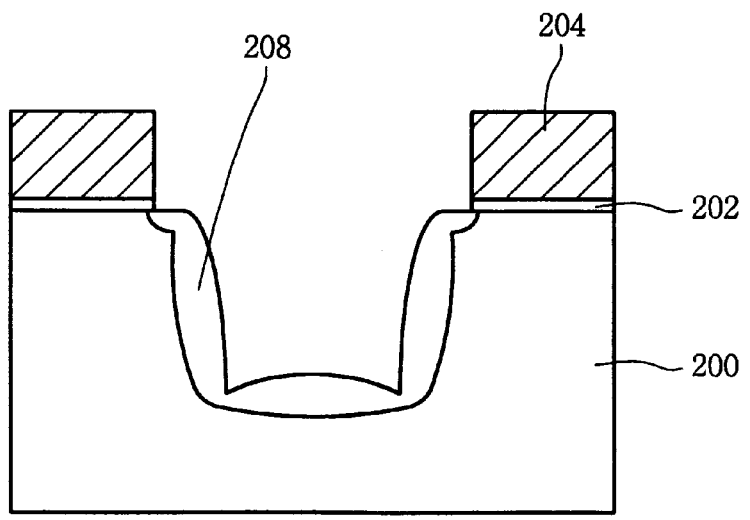

As illustrated in FIG. 14, the spacer 206 is removed by etching. A second insulating layer 208 of a thermal oxidation layer is formed along the inner surface of the trench. Here, the second insulating layer 208 is formed having a thickness of 150 to 300 Å.

Figure 15:
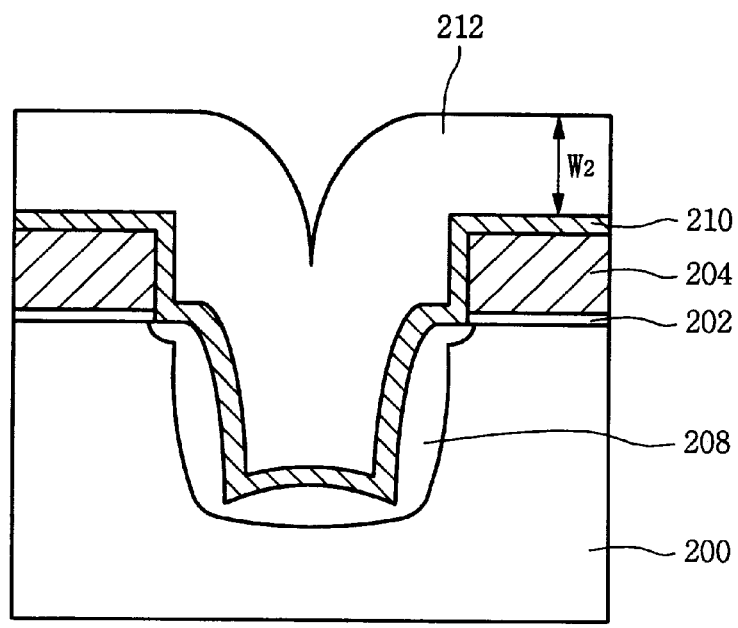

As illustrated in FIG. 15, a second anti-oxidation layer 210 of a nitride layer is formed on the second insulating layer 208, the first insulating layer 202, and the first anti-oxidation layer 204. Here, the second anti-oxidation layer 210 is formed in the range of 60 to 150 Å in thickness. Thereafter, a third insulating layer 212 of an oxide layer is formed by CVD on the second anti-oxidation layer 210 including the trench in the range of 5000 to 6000 Å in thickness, which is indicated as W2 in FIG. 15, to completely fill the trench. Here, the third insulating layer 212 is formed of a single-layered structure of TEOS or multi-layered structure of "USG/TEOS".

Figure 16:
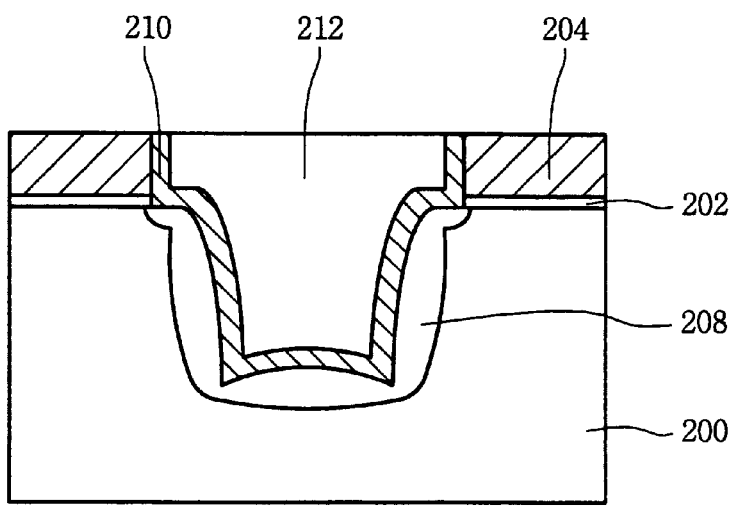

As illustrated in FIG. 16, the third insulating layer 212 is planarized by a CMP process to expose the first and second anti-oxidation layers 204 and 210 or to expose the second anti-oxidation layer 210. Here, the first and second anti-oxidation layers 204 and 210 are etched to a predetermined thickness as illustrated in FIG. 16, by the CMP process when the third insulating layer 212 is planarized.

Figure 17:
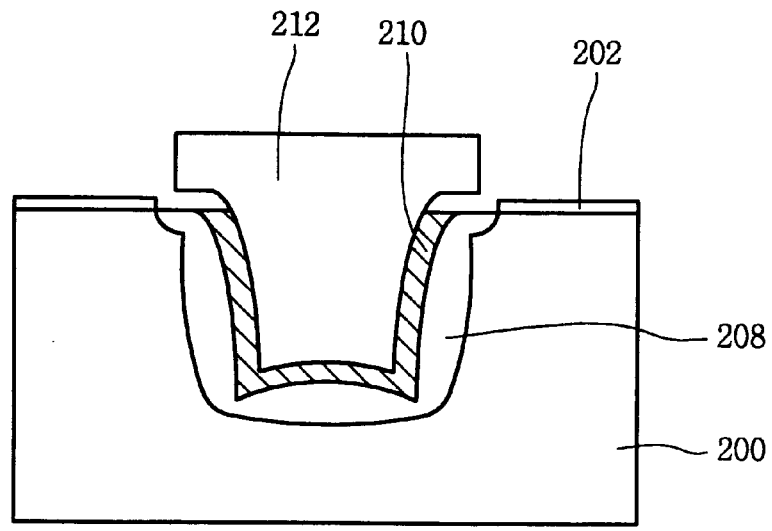

As illustrated in FIG. 17, the first anti-oxidation layer 204 of an active region is removed, using the isotropic etching process. In this step, the second anti-oxidation layer 210 on the side of the third insulating layer 212 and the second anti-oxidation layer 210 on the second insulating layer 208 are partially etched.

Figure 18:
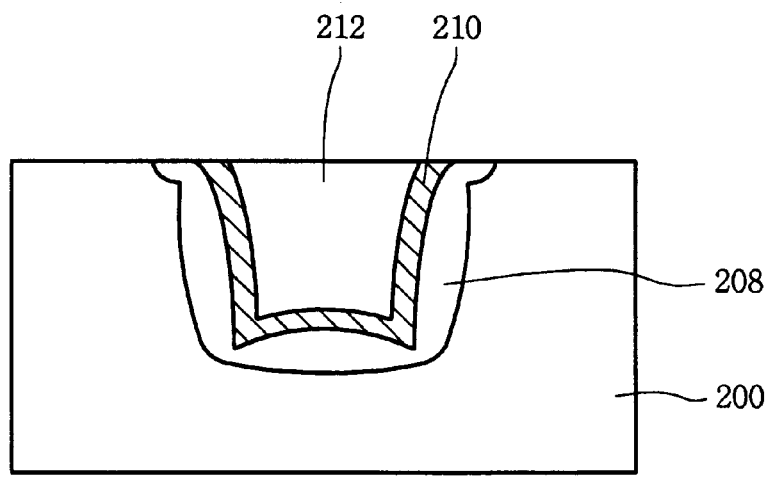

As illustrated in FIG. 18, a predetermined upper portion of the first insulating layer 202 of the active region and the upper part of the third insulating layer 212 of the non-active region are etched by wet cleaning process, so that "the trench isolation" is formed of the second anti-oxidation layer 210 and the second and third insulating layers 208 and 212. A buffer oxidation layer (now shown) is formed on the active region of the substrate 200. An ion-implantation process for forming a well and other ion-implantation for controlling threshold voltage are performed and the buffer oxidation layer is removed.

In this embodiment also, though the second anti-oxidation layer 210 being a nitride liner is formed in the range of 60 to 150 Å in thickness, the layer 210 in the trench is not etched to form a groove on the edge of the when removing the first anti-oxidation layer 204 on the active region trench isolation".

As described above, with the present invention, though the anti-oxidation layer (a nitride liner) on the inner surface of the trench is formed relatively thick, a concave groove is not generated on the edges of the "trench isolation". As a result, (1) the polysilicon does not remain during the etching process for forming a gate electrode, thus preventing the generation of an undesired characteristic (for example, a characteristic resulted from the short in the gate electrode) due to the remaining polysilicon, and (2) even though a subsequent oxidation process is performed after the formation of "the trench isolation", the oxidation of the trench's side wall can be prevented by using the second anti-oxidation layer, thus preventing the damage of the silicon substrate on the side wall of the trench.

It will be apparent to those skilled in the art that various modifications and variations can be made in the semiconductor device fabricating method of the present invention without departing from the spirit or scope of the invention. Thus, it is intended that the present invention cover the modifications and variations of this invention provided they come within the scope of the appended claims and their equivalents.

What is claimed is:

1. A method of fabricating a semiconductor device, comprising the steps of:
    providing a semiconductor substrate;
    forming a first insulation layer on a surface of the substrate;
    forming a first anti-oxidation layer on the first insulation layer;
    exposing a region of the surface of the substrate by patterning the first anti-oxidation layer and the first insulating layer;
    forming a trench in the substrate by etching the exposed surface of the substrate, isotropically etching the first anti-oxidation layer, thereby exposing a portion of the first insulating layer,
    forming a second anti-oxidation layer on the resultant structure, the second anti-oxidation layer including a horizontal portion atop the exposed portion of the first insulating layer;
    forming a third insulating layer on the second anti-oxidation layer to fill the trench;
    planarizing the third insulating layer and for exposing the second anti-oxidation layers; and
    removing the first anti-oxidation layer and a portion of the second anti-oxidation layer.

2. A method of fabricating a semiconductor device, comprising the steps of:
    providing a semiconductor substrate;
    forming a first insulation layer on a surface of the substrate;
    forming a first anti-oxidation layer on the first insulation layer;
    exposing a region of the surface of the substrate by patterning the first anti-oxidation layer and the first insulating layer;
    forming a trench in the substrate by etching the exposed surface of the substrate;
    forming a second insulating layer along an inner surface of the trench;
    isotropically etching the first anti-oxidation layer, thereby exposing an upper surface of the second insulating layer;
    forming a second anti-oxidation layer on the resultant structure, the second anti-oxidation layer including a horizontal portion atop the exposed upper surface of the second insulating layer;
    forming a third insulating layer on the second anti-oxidation layer to fill the trench;
    planarizing the third insulating layer for exposing the second anti-oxidation layers; and
    removing the first anti-oxidation layer and a portion of the second anti-oxidation layer.

3. The method as claimed in claim 2, wherein the first insulating layer is formed of a thermal oxidation layer in the range of 120 to 180 Å in thickness.

4. The method as claimed in claim 2, wherein the second insulating layer is formed of a heat-oxidation layer in the range of 150 to 300 Å in thickness.

5. The method as claimed in claim 2, wherein the first anti-oxidation layer is formed of a nitride layer in the range of 1300 to 1700 Å in thickness.

6. The method as claimed in claim 2, wherein the second anti-oxidation layer is formed of a nitride layer in the range of 60 to 150 Å in thickness.

7. The method as claimed in claim 2, wherein the first anti-oxidation layer having a first thickness is isotropically etched to have a second thickness, the second thickness being about ½ to 9/10 of the first thickness.

8. The method as claimed in claim 2, wherein the third insulating layer is formed of an oxide layer in the range of 5000 to 6000 Å in thickness.

9. The method as claimed in claim 2, wherein the oxidation layer is selected from the group consisting of a TEOS single-layer and an USG/TEOS multi-layer.

10. The method as claimed in claim 2, wherein the first anti-oxidation layer is removed by using an isotropic etching process.

11. A method of fabricating a semiconductor device, comprising the steps of:

provinding a semiconductor substrate;

forming a first insulating layer on a surface of the substrate;

forming a first anti-oxidation layer on the first insulating layer;

exposing a region of the surface of the substrate and forming sidewalls in the first insulating layer and the first anti-oxidation layer adjacent to the exposed region of the surface of the substrate by patterning the first anti-oxidation layer and the first insulating layer;

forming a spacer on the side walls;

forming a trench in the substrate by etching the exposed surface of the substrate;

removing the spacer;

forming the second insulating layer along an inner surface of the trench;

forming a second anti-oxidation layer on the resultant structure;

forming a third insulating layer on the second anti-oxidation layer to fill the trench;

planarizing the third insulating layer for exposing the second anti-oxidation layers; and removing the first anti-oxidation layer and a portion of the second anti-oxidation layer.

12. The method as claimed in claim 1, wherein the first insulating layer is formed of a heat-oxidation layer in the range of 120 to 180 Å in thickness.

13. The method as claimed in claim 11, wherein the first anti-oxidation layer is formed of a nitride layer in the range of 1300 to 1700 Å in thickness.

14. The method as claimed in claim 11, wherein the step of forming a spacer comprises steps of:

forming a high-temperature oxide layer to a predetermined thickness on the first insulating layer and the first anti-oxidation layer; and anisotropically etching the high-temperature oxide layer.

15. The method as claimed in claim 14, wherein the high-temperature oxide layer has a thickness of 400 to 600 Å.

16. The method as claimed in claim 1, wherein the second insulating layer is formed of a thermal oxidation layer in the range of 150 to 300 Å in thickness.

17. The method as claimed in claim 11, wherein the second anti-oxidation layer is formed of a nitride layer in the range of 60 to 150 Å in thickness.

18. The method as claimed in claim 11, wherein the third insulating layer is formed of an oxide layer in the range of 5000 to 6000 Å in thickness.

19. The method as claimed in claim 18, wherein the oxidation layer is selected from the group consisting of a TEOS single-layer and an USG/TEOS multi-layer.

20. The method as claimed in claim 11, wherein the first anti-oxidation layer is removed by using an isotropic etching process.

* * * * *

UNITED STATES PATENT AND TRADEMARK OFFICE
CERTIFICATE OF CORRECTION

PATENT NO. : 6,239,030 B1
DATED : May 29, 2001
INVENTOR(S) : Mun

It is certified that error appears in the above-identified patent and that said Letters Patent is hereby corrected as shown below:

Column 1,
Line 12, "or" should read -- for --.

Column 5,
Line 35, "there Here" should read -- there. Here --.

Column 9,
Line 29, "claim 1" should read -- claim 11 --.

Column 10,
Line 14, "claim 1" should read -- claim 11 --.

Signed and Sealed this

Seventeenth Day of December, 2002

JAMES E. ROGAN
*Director of the United States Patent and Trademark Office*